(12) United States Patent
Kato

(10) Patent No.: US 6,534,831 B2
(45) Date of Patent: Mar. 18, 2003

(54) SEMICONDUCTOR INTEGRATED CIRCUIT DEVICE

(75) Inventor: Katsuhiro Kato, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/811,391

(22) Filed: Mar. 20, 2001

(65) Prior Publication Data

US 2001/0033001 A1 Oct. 25, 2001

(30) Foreign Application Priority Data

Apr. 19, 2000 (JP) ........................................ 2000-117992

(51) Int. Cl.$^7$ ................................................ H01L 29/72
(52) U.S. Cl. ........................ 257/347; 257/401; 257/532; 257/774
(58) Field of Search ................................ 257/347, 532, 257/401, 774

(56) References Cited

U.S. PATENT DOCUMENTS

| | | | |
|---|---|---|---|
| 5,340,754 A | * | 8/1994 | Witek et al. ................. 257/532 |
| 5,841,172 A | | 11/1998 | Morishita et al. |
| 5,889,293 A | | 3/1999 | Rutten et al. |
| 6,046,476 A | | 4/2000 | Morishita et al. |
| 6,188,122 B1 | * | 2/2001 | Davari et al. ................. 257/532 |

* cited by examiner

*Primary Examiner*—Edward Wojciechowicz
(74) *Attorney, Agent, or Firm*—Rabin & Berdo, P.C.

(57) ABSTRACT

A trench 312*a* passing through an impurity area 301*a* of a circuit element formed at a semiconductor layer 306 of an SOI substrate 314 and extending to a conductive layer 311 formed at a semiconductor substrate 304 is provided. Inside the trench 312*a*, a conductor 310*a* for electrically connecting the impurity area 301*a* of the circuit element and the conductive layer 311 is formed. By adopting this structure, it becomes possible to promptly transmit a surge voltage applied through an external connector terminal 101 to the semiconductor substrate 304 to prevent breakdown at the buried insulator layer. Thus, the buried insulator layer in a semiconductor integrated circuit device having an SOI structure is protected by providing a protective element under the impurity area of the integrated circuit element to assure a high degree of reliability while enabling high-speed drive and higher integration.

34 Claims, 4 Drawing Sheets

SEMICONDUCTOR INTEGRATED CIRCUIT DEVICE

BACKGROUND OF THE INVENTION

1. Field of the Invention

The present invention relates to a semiconductor integrated circuit device and, more specifically, it relates to a technology that may be effectively adopted in a semiconductor integrated circuit device having an SOI (silicon-on-insulator) structure.

2. Description of the Related Art

Today, a technology called SOI is often adopted in semiconductor integrated circuit devices to realize a further reduction in power consumption and faster operation. In the SOI technology in the prior art, an SOI substrate, which is achieved by forming an insulator layer (a buried insulator layer) on a semiconductor substrate and then forming a semiconductor layer via the insulator layer is used. The semiconductor integrated circuit is constituted by forming an impurity area at the semiconductor layer of the SOI substrate and forming a circuit element such as a MOS transistor with the impurity area.

In the SOI technology described above, an SOI substrate having a structure in which the semiconductor substrate and the semiconductor layer at which circuit elements are formed are electrically insulated from one another by the buried insulator layer is used to realize a reduction in power consumption and faster operation.

As a result, there is a problem with semiconductor integrated circuit devices in the prior art in that if a high surge voltage is applied to a circuit element at the semiconductor layer through an external connector terminal or the like, the surge voltage at the semiconductor layer is not transmitted to the semiconductor substrate, resulting in an extremely large difference between the potential at the semiconductor substrate and the potential at the semiconductor layer.

In other words, in a semiconductor integrated circuit device adopting the SOI technology in the prior art, the large potential difference causes a breakdown at the insulator layer present between the semiconductor substrate and the semiconductor layer, and such a breakdown occurring at the insulator layer greatly reduces the reliability of the semiconductor integrated circuit.

SUMMARY OF THE INVENTION

Accordingly, an object of the present invention is to provide a semiconductor integrated circuit device having an SOI structure, with which it is possible to prevent breakdown from occurring at the buried insulator layer and to maintain a high degree of reliability.

In order to achieve the object described above, a first semiconductor integrated circuit device according to the present invention comprises a first circuit element constituted of a semiconductor substrate of a first conductivity type (hereinafter also referred to as "conduction type"), a semiconductor layer formed on the semiconductor substrate via an insulator layer, a first element formation area formed at the semiconductor layer, a first impurity area formed at the first element formation area, a second impurity area formed at the first element formation area over a specific distance from the first impurity area and connected to an electrode pad and a first gate electrode provided above the area between the first impurity area and the second impurity area, a first area of a second conduction type formed at the semiconductor substrate under at least either the first impurity area or the second impurity area and a first conductor passing through an insulator layer present between the first or second impurity area and the first area to connect the first or second impurity area to the first area.

A second semiconductor integrated circuit device according to the present invention comprises a first circuit element constituted of a semiconductor substrate of a first conduction type, a semiconductor layer formed on the semiconductor substrate via an insulator layer, a first element formation area formed at the semiconductor layer, a first impurity area formed at the first element formation area, a second impurity area formed at the first element formation area over a specific distance from the first impurity area and connected to an electrode pad and a first gate electrode provided above the area between the first impurity area and the second impurity area, a first area of the first conduction type formed at the semiconductor substrate under the first impurity area and a first conductor passing through an insulator layer present between the first impurity area and the first area to connect the first impurity area to the first area.

A third semiconductor integrated circuit device according to the present invention comprises a first circuit element constituted of a semiconductor substrate of a first conduction type, a semiconductor layer formed on the semiconductor substrate via an insulator layer, a first element formation area formed at the semiconductor layer, a first impurity area formed at the first element formation area, a second impurity area formed at the first element formation area over a specific distance from the first impurity area and connected to an electrode pad and a first gate electrode provided above the area between the first impurity area and the second impurity area, a first area of the first conduction type formed at the semiconductor substrate under the first impurity area, a first conductor passing through an insulator layer present between the first impurity area and the first area to connect the first impurity area to the first area and also passing through the first impurity area and a second conductor formed at a position away from the first conductor over a specific distance, which achieves a potential essentially equal to the potential at the first conductor at the surface of the first impurity area.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 8:
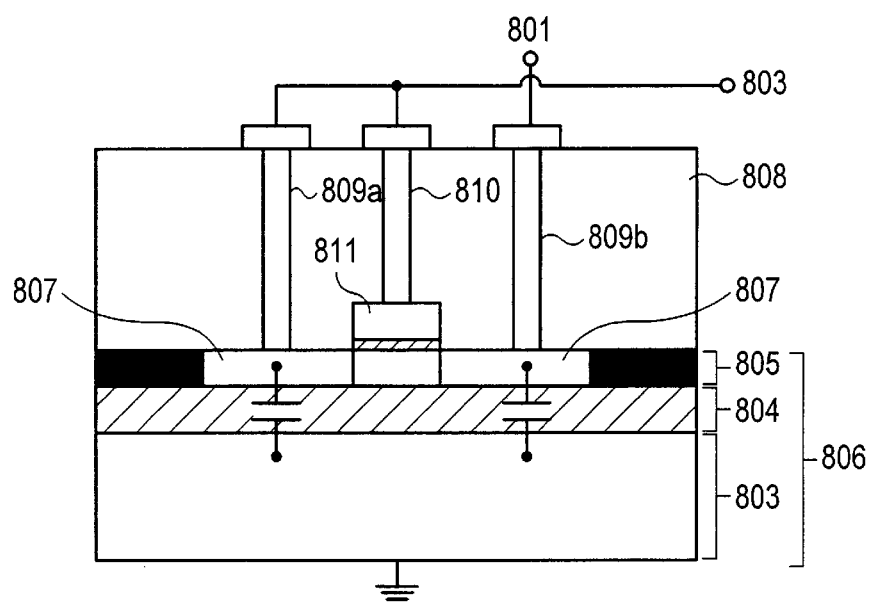
FIG. 8 is a sectional view of a standard semiconductor integrated circuit device.

First, a standard semiconductor integrated circuit device adopting the SOI technology is explained. FIG. 8 illustrates a standard semiconductor integrated circuit device adopting the SOI technology. As shown in FIG. 8, in the standard SOI technology, an SOI substrate 806 achieved by forming an insulator layer (a buried insulator layer) 804 on a semiconductor substrate 803 and then forming a semiconductor layer 805 via the insulator layer 804 is used. An impurity area 807 is formed in the semiconductor layer 805 of the SOI substrate 806, and a circuit element such as a MOS transistor is formed by using the impurity area to constitute a semiconductor integrated circuit. In addition, the impurity area constituting the circuit element is electrically connected with an electrode pad such as an external connector terminal 801, a ground terminal 802 or an internal circuit. In this structure, reference number 808 indicates an insulating film, reference numbers 809a and 809b indicate conductors connected to the impurity area 807, and reference number 810 indicates a conductor connected to a gate electrode 811.

Figure 1:
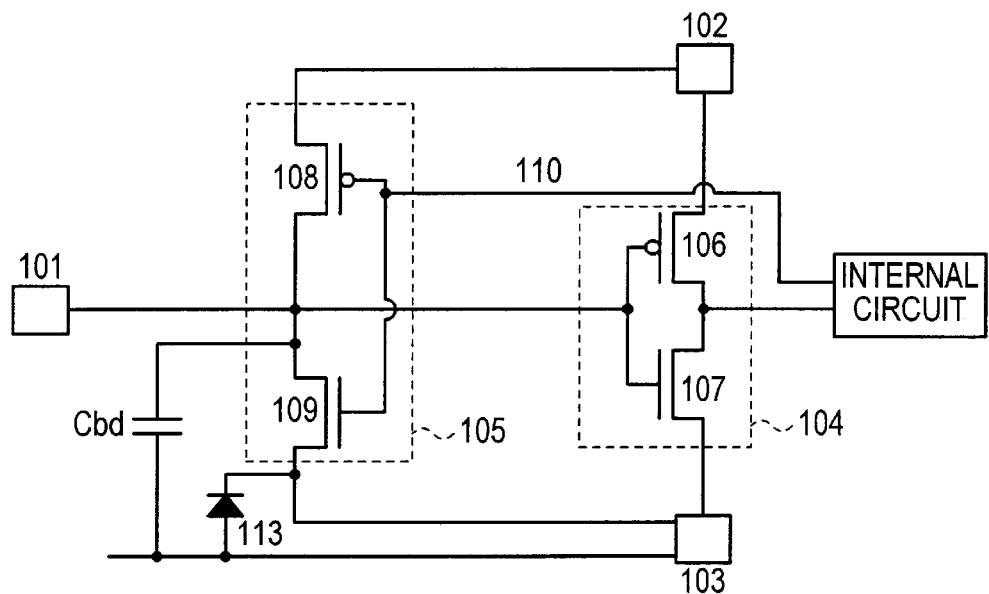
FIG. 1 is a circuit diagram of the semiconductor integrated circuit in a first embodiment.
Figure 2:
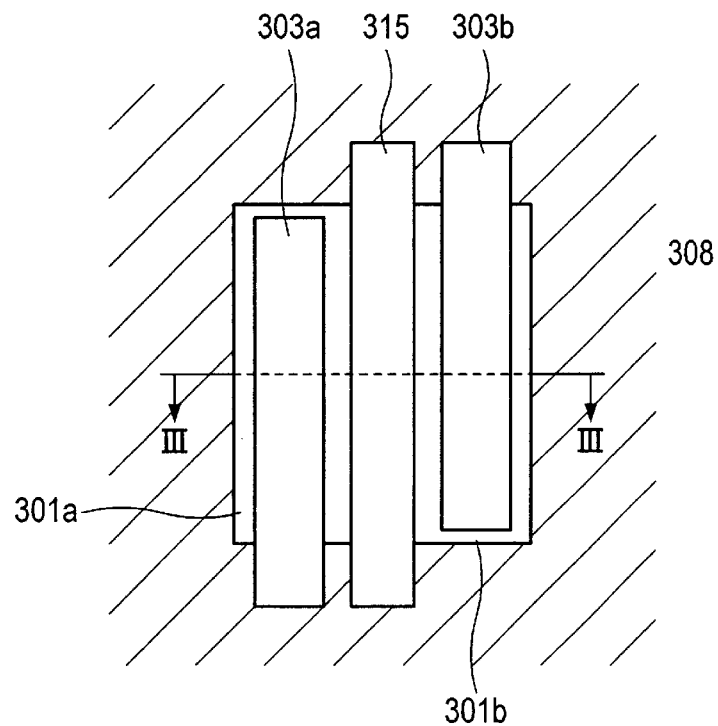
FIG. 2 is a plan view of an essential portion of the output circuit element constituting the output circuit in the first embodiment, and similarly of the second, third fourth embodiments.
Figure 3:
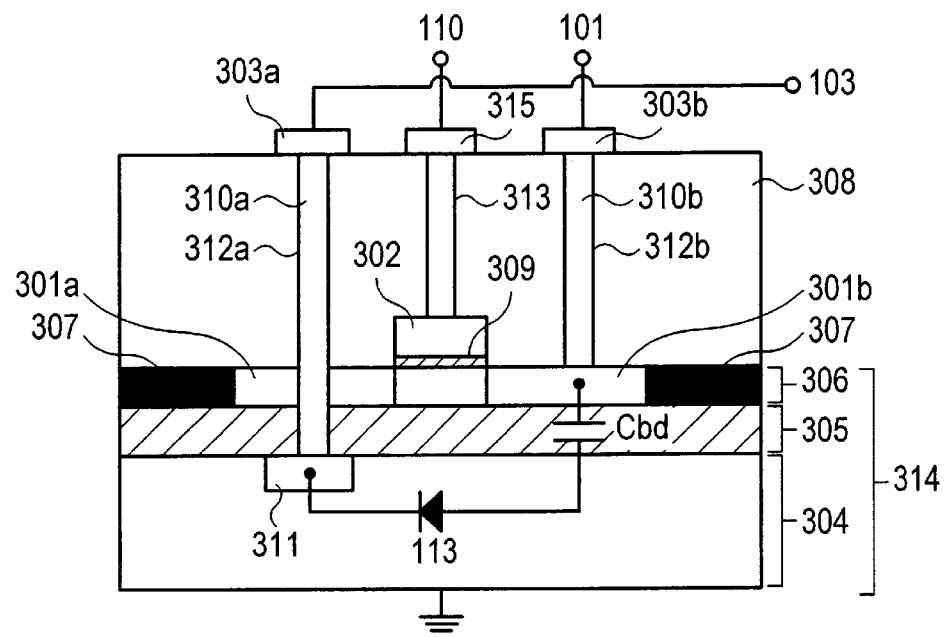
FIG. 3 is a cross section through line III—III in FIG. 2 in accordance with the first embodiment.

The following is an explanation of the embodiments of the present invention, given with reference to the drawings. FIGS. 1, 2 and 3 illustrate the first embodiment of the present invention, with FIG. 1 presenting a circuit diagram of the semiconductor integrated circuit achieved in the embodiment, FIG. 2 presenting a plan view of an essential portion corresponding to the output circuit unit in the semiconductor integrated circuit device and FIG. 3 presenting a cross section through line III—III in FIG. 2, for the first embodiment. It is to be noted that "Cbd" in FIGS. 1 and 3 indicates an area of the buried insulator layer over which breakdown may occur in the semiconductor integrated circuit device having the SOI structure. In this specification, the presence of the insulator layer is indicated by providing the parasitic capacitance since the insulator layer itself cannot be indicated with a circuit reference symbol.

As shown in FIG. 1, the semiconductor integrated circuit device in the first embodiment includes an external connector terminal 101 constituted of an electrode pad which is electrically connected with the outside, an input circuit that receives a signal from the external connector terminal 101 and outputs a signal to an internal circuit, the internal circuit that engages in a specific operation in response to the signal received from the input circuit and an output circuit that outputs a signal provided by the internal circuit to the external connector terminal 101. The input circuit that provides a signal to the internal circuit may be constituted of, for instance, a CMOS (complementary MOS) inverter input circuit 104 comprising a p-channel MOSFET (metal-oxide-semiconductor field-effect-transistor, hereafter simply referred to as a pMOS) input circuit element 106 and an n-channel MOSFET (hereafter simply referred to as an nMOS) input circuit element 107.

The output circuit is connected between the external connector terminal 101 and the internal circuit. As is the input circuit described above, which is constituted of a CMOS inverter input circuit, the output circuit is constituted of a CMOS inverter output circuit 105 comprising circuit elements such as a pMOS output circuit element 108 and an nMOS output circuit element 109.

It is to be noted that an explanation is given with reference to the embodiment for an example in which both the input circuit and the output circuit are constituted of a CMOS inverter. However, neither the input circuit nor the output circuit needs to be constituted of a CMOS inverter, as long as they are connected between the internal circuit and the external connector terminal 101 to input/output a signal to/from the internal circuit. Accordingly, they may each be constituted of an nMOS or a pMOS alone.

In addition, the pMOS input circuit element 106 and the nMOS input circuit element 107 constituting the CMOS inverter input circuit 104 are connected in series between a source terminal 102 and a ground terminal 103, with the individual gate electrodes of the pMOS input circuit element 106 and the nMOS input circuit element 107 connected to the external connector terminal 101 in this embodiment.

Likewise, the pMOS output circuit element 108 and the nMOS output circuit element 109 constituting the CMOS inverter output circuit 105 in the embodiments are connected in series between the source terminal 102 and the ground terminal 103, with the individual drain areas of the pMOS output circuit element 108 and the nMOS output circuit element 109 connected to the external connector terminal 101 and the individual gate electrodes connected to an output signal line 110 through which a signal from the internal circuit is transmitted.

An explanation is given with reference to the first embodiment on an example in which the nMOS output circuit element 109 connected between the external connector terminal 101 and the internal circuit constitutes a first circuit element. However, the term "first circuit element" according to the present invention refers to any element having an impurity area that is connected to the external connector terminal 101. Accordingly, a first circuit element may be, for instance, a diffused resistor formed by inducing an impurity to an nMOS, a pMOS or the semiconductor layer.

Next, with reference to the first embodiment, an explanation is given for an example in which the present invention is adopted in the output circuit 105 constituted of a CMOS inverter and, in particular, in the nMOS output circuit element 109.

FIG. 2 is plan view of the nMOS output circuit element 109 and FIG. 3 is a cross section through line III—III in FIG. 2 for the first embodiment.

In FIG. 3, a semiconductor substrate 304, which may be constituted of, for instance, a p-type silicon (Si) single crystal, is connected to the ground terminal 103. Over the semiconductor substrate 304, an insulator layer 305, which may be constituted of, for instance, silicon dioxide (SiO2), is formed. In addition, above the insulator layer 305, a semiconductor layer 306 constituted of an Si single crystal is formed. Integrated circuit elements are formed at the semiconductor layer 306.

Namely, the semiconductor integrated circuit device in the embodiment achieves an SOI structure having the semiconductor layer 306 formed over the insulator layer 305.

At the semiconductor layer 306, a field insulating film 307 constituted of, for instance, SiO2 is formed. This film is provided to electrically isolate adjacent integrated circuit elements from each other, and thus, they define element formation areas.

In addition, at an element formation area enclosed by the field insulating film 307, the nMOS output circuit element 109 is formed, and a first area (an area of first conductive type) 311 is formed at the semiconductor substrate 304 under the element formation area.

As illustrated in FIG. 3, the nMOS output circuit element 109 comprises a source area (a first impurity area) 301a and a drain area (a second impurity area) 301b each constituted of an impurity area formed at the semiconductor layer 306, a gate insulating film 309 and a gate electrode (a first gate electrode) 302 formed over the gate insulating film 309. An insulating film 308 is deposited over the semiconductor layer 306.

The gate insulating film 309 may be constituted of, for instance, SiO2. In addition, the gate electrode 302 (the first gate electrode) may be constituted of, for instance, low-resistance polysilicon having a specific impurity such as phosphorus (P) or arsenic (As) induced into it. The gate electrode 302 is connected to the output signal line 110 to which a signal output from the internal circuit is provided.

Boron (B), which is a p-type impurity, is induced into the semiconductor layer 306. For instance arsenic (As), which is an n-type impurity, is induced into the source area 301a and the drain area 301b.

Furthermore, the insulating film 308 is deposited over the semiconductor layer 306, and a first trench 312a, which passes through the source area 301a constituting an impurity area of the nMOS output circuit element 109 and the insulating film 305 and extends to the semiconductor substrate 304, is provided.

In the first embodiment, at a portion of the semiconductor substrate 304 located under the source area 301a through which the first trench 312a is provided, the first conductive area 311 of a second conductivity type (hereinafter also referred to as "conduction type") having an n-type impurity such as As induced into it, for instance, thus achieving conductivity which is the reverse of the conductivity at the semiconductor substrate 304 is provided.

In addition, a first conductor 310a constituted of, for instance, tungsten, which electrically connects the first conductive area 311, the source area 301a constituting an impurity area of the first circuit element and a source electrode 303a, is formed inside the first trench 312a. The source electrode 303a, which may be constituted of a metal such as aluminum (Al) or an Al alloy, is electrically connected with the ground terminal 103.

By adopting this structure, a PN junction diode 113 is formed between the semiconductor substrate 304 and the first conductive layer 311.

At the drain area 301b, a trench 312b which passes through only the insulating film 308 deposited over the semiconductor layer 306 is formed, and the drain area 301b and a drain electrode 303b constituted of a metal such as Al or an Al alloy are electrically connected with each other via a conductor 310b formed inside the trench 312b. In this structure, the drain electrode 303b is electrically connected with the external connector terminal 101.

In the embodiment, the PN junction diode 113 is formed inside the semiconductor substrate 304 by providing the n-type first conductive area 311 at the p-type semiconductor substrate 304 directly under the source area 301a. A surge voltage applied to the semiconductor layer 306 is transmitted quickly to the semiconductor substrate 304 under the insulator layer 305 by the PN junction diode 113, to reduce the difference between the potentials at the semiconductor layer 306 and the semiconductor substrate 304. Namely, in the first embodiment, the PN junction diode 113 functions as a protective element that protects the buried insulator layer 305 from an external surge voltage.

In other words, a surge voltage applied through the external connector terminal 101 first travels from the drain area 301b of the nMOS output circuit element 109 through the channel area formed under the gate electrode 302 to be transmitted to the source area 301a. Then, the surge voltage, which has been transmitted to the source area 301a is promptly transmitted to the area of the semiconductor substrate 304 under the insulator layer, i.e., the area under the drain area 301b where the highest level of surge voltage is applied via the PN junction diode 113 connected to the source area 301a. As a result, the levels of the voltages applied to the semiconductor layer 306 and the semiconductor substrate 304 become roughly equalized, to prevent breakdown at the insulator layer due to a high level of surge voltage applied through the external connector terminal 101.

An explanation has been given with reference to the first embodiment for an example in which a protective element, which passes through the source area 301a alone, is formed. By adopting this structure, it becomes possible to provide a protective element without having to increase the capacitance between the external connector terminal 101 and the semiconductor substrate 304. Consequently, a semiconductor integrated circuit, in which breakdown of the insulator layer under the integrated circuit is prevented without entailing an operational delay, is obtained.

In addition, the embodiment may be adopted in the drain area 301b, as well, to provide a protective element (PN junction diode) connected to the drain area 301b.

By providing an additional protective element constituted of a PN junction diode under the drain area 301b, as well, breakdown, at the buried insulator layer 305 located under the drain area where a high level of surge voltage from the outside is directly applied and, thus, breakdown would occur most readily, is prevented with a higher degree of reliability compared to the structure provided only with the protective element passing through the source area 301a alone, since the presence of the protective element connected with the drain area 301b to which the surge voltage from the outside is directly applied reduces the distance between the insulator layer 305 to be protected and the protective element that transmits the surge voltage to the semiconductor substrate 304. As a result, the high surge voltage applied from the outside is transmitted to the portion of the semiconductor substrate 304 under the drain area 301b via the PN junction diode 113 immediately after the surge voltage is applied to the drain electrode 303b, thereby promptly reducing the electrical field applied to the insulator layer 305 under the drain area. Consequently, breakdown at the buried insulator layer 305 can be prevented with an even higher degree of reliability.

It is to be noted that when forming a protective element passing through the drain area 301b, the PN junction diode 113 constituting the protective element is formed between the external connector terminal 101 and the ground terminal 103. This results in an increase in the capacitance between the external connector terminal 101 and the semiconductor substrate 304. Accordingly, it is necessary to implement an adjustment such as reducing the number of protective elements to be provided so as to ensure that the high-speed operation is not adversely affected by forming a protective element under the drain area 301b.

The semiconductor integrated circuit device having the SOI structure described above may be manufactured through the process described below.

First, the SOI substrate 314 in FIG. 3 is formed by implanting a high concentration of oxygen ions into the p-type semiconductor substrate 304 and achieving full dielectric isolation with the buried insulator layer 305 formed inside the semiconductor substrate 304 through, for instance, the SIMOX (separation by implanted oxygen) method of the known art.

Then, phosphorous (P), which is an n-type impurity, is induced into the area of the semiconductor layer 306 over which the pMOS output circuit element 108 (see FIG. 1) is to be formed.

In the following step, after forming the field insulating film 307 at the semiconductor layer 306 through a LOCOS (local oxidation of silicon) method of the known art, for instance, the gate insulating film 309 is formed over the semiconductor layer 306 through, for instance, thermal oxidation.

Next, after depositing a polysilicon film on the SOI substrate 314, the polysilicon film is patterned through photolithography to form the gate electrode 302 on the gate insulating film.

Then, a resist pattern is formed on the SOI substrate 314 over the area where the pMOS output circuit element 108 is to be formed. Subsequently, by using the resist pattern as a mask, As, which is an n-type impurity, is implanted through ion implantation or the like into the area of the semiconductor layer 306 over which the nMOS output circuit element 109 (see FIG. 1) is to be formed, and then a heat treatment is implemented. Through this process, the source area 301a (the first impurity area) and the drain area 301b (the second impurity area), constituting impurity areas of the nMOS output circuit element 109 are formed and the nMOS output circuit element 109 is formed on the semiconductor layer 306.

Then, the resist pattern on the pMOS output circuit element 108 is removed and, as in the formation of the nMOS output circuit element 109, the pMOS output circuit element 108 is formed by forming a source area and a drain area in the area over which the pMOS output circuit element 108 is to be formed. However, a p-type impurity, for instance boron, should be induced in this case.

Next, after depositing the insulating film 308 through, for instance, CVD over the SOI substrate 314, the individual trenches extending to the source area 301a, the drain area 301b and the gate electrode 302 are formed for instance through dry etching of the known art. Then, a resist is applied onto the area other than an impurity area connected with a protective element, i.e., the area excluding the trench formed over the source area 301 in this embodiment. After the resist is applied, an etching process is performed through dry etching of the known art or the like to form the first trench 312a passing through the insulator layer 305 and extending to the semiconductor substrate 304.

Alternatively, after the output circuit elements are formed, a sputtering process of the known art may be implemented before depositing the insulating film 308 over the SOI substrate 314, to form a metal film at the area over which trenches other than the first trench 312a are to be formed (the drain area and the gate electrode). Then, the trenches extending to the drain area 301b and the gate electrode 302 and the first trench 312a extending to the semiconductor substrate 304 may be formed by depositing the insulating film 308 over the SOI substrate 314 and implementing a dry etching process of the known art.

After the first trench 312a is formed, an impurity achieving a conductivity that is the reverse of the conduction of the semiconductor substrate 304, e.g., As which is an n-type impurity, is induced through ion implantation or the like via the first trench to form the first conductive area 311 on the semiconductor substrate 304. The PN junction diode 113 constituting a protective element is formed between the first conductive area 311 and the semiconductor substrate 304. The concentration of the impurity induced into the semiconductor substrate 304 during this process should be set at, for instance, $1 \times 10^{17 \sim 19}$ ions/cm$^3$. Next, tungsten (W) or the like is grown inside the first trench 312a, and the first conductor 310a, which connects the first conductive area 311 that has already been formed and the source area 301a constituting the impurity area of the circuit element, is formed.

Subsequently, after depositing a metal film constituted of Al or an Al alloy through, for instance, sputtering on the SOI substrate, the metal film is patterned through photolithography to form the output circuit 105. Then, the output circuit 105 is electrically connected with the external connector terminal 101 and other elements such as the internal circuit. Through these steps, the semiconductor integrated circuit achieving the object of the present invention is manufactured.

As explained above, in the first embodiment, the surge voltage from the outside is transmitted to the semiconductor substrate 304 and the buried insulator layer 305 located under the semiconductor layer at which the semiconductor integrated circuit is formed is protected from breakdown by forming the PN junction 113 directly under the nMOS output circuit element 109 as a protective element connected with the impurity area of the circuit element. By providing the PN junction diode 113 connected with the impurity area of the circuit element formed at the semiconductor layer in this manner, a semiconductor integrated circuit device achieving a high degree of reliability is realized.

In addition, the first embodiment in which the PN junction diode 113 is formed directly under the source area 301a of the output circuit to protect the insulator layer 305 does not require a special area to accommodate the protective element for protecting the buried insulator layer. As a result, the available area can be utilized efficiently while preventing a breakdown from occurring at the insulator layer 305. In other words, by adopting the embodiment, a semiconductor integrated circuit that enables even higher integration while maintaining a high degree of reliability can be obtained.

Figure 4:
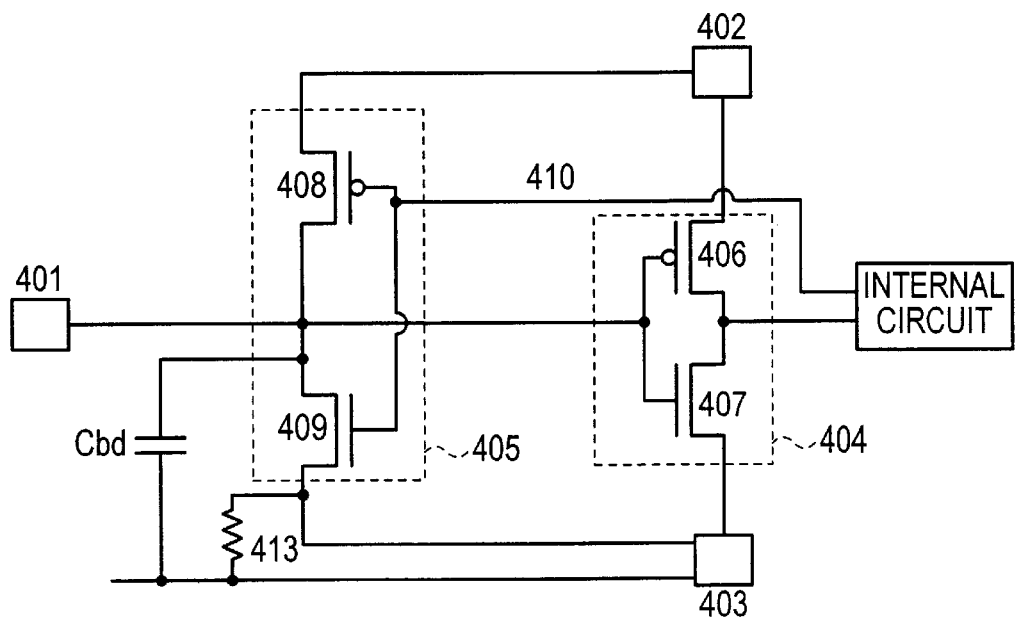
FIG. 4 is a circuit diagram of the semiconductor integrated circuit in a second embodiment.
Figure 5:
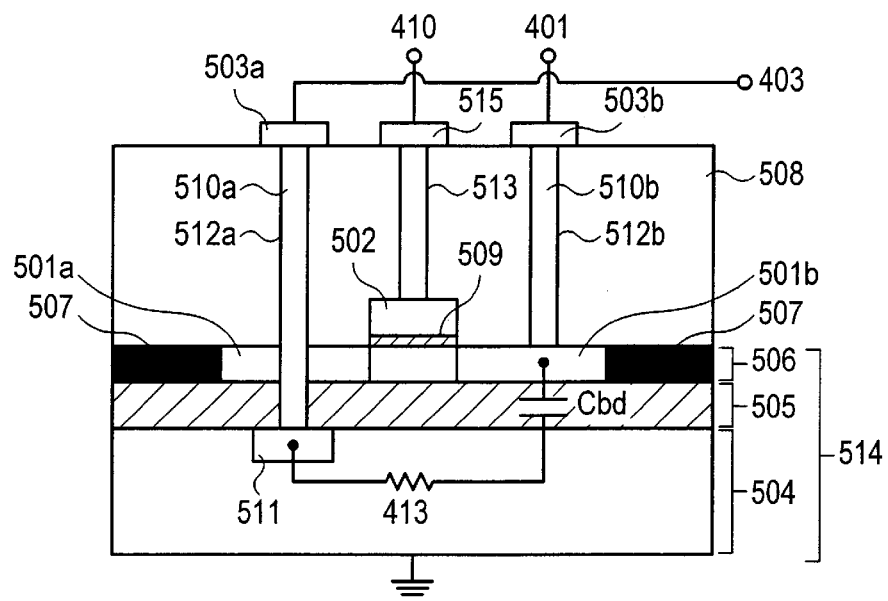
FIG. 5 is a cross section through line III—III in FIG. 2 for the second embodiment, particularly of the output circuit element constituting the output circuit in the semiconductor integrated circuit device of the second embodiment.

Next, the second embodiment of the present invention is explained with reference to the drawings. FIGS. 4 and 5 illustrate the embodiment, with FIG. 4 presenting a circuit diagram of the semiconductor integrated circuit achieved in the embodiment and FIG. 5 presenting a cross section through line III—III in FIG. 2. It is to be noted that the plan view of this second embodiment is identical to that presented in FIG. 2 illustrating the first embodiment and is, therefore, omitted.

As shown in FIG. 4, the semiconductor integrated circuit device in the second embodiment, too, is provided with a CMOS inverter input circuit 404, comprising, for instance, a pMOS input circuit element 406 and an nMOS input circuit element 407, which functions as an input circuit that receives a signal via an external connector terminal 401 and outputs a signal to an internal circuit, as in the first embodiment.

In addition, in this embodiment, too, a CMOS inverter output circuit 405 comprising a pMOS output circuit 408, an nMOS output circuit element 409 and the like, which outputs a signal from the internal circuit to the external connector terminal 401, for instance, is connected between the external connector terminal 401 and the internal circuit.

Furthermore, in the embodiment, the CMOS inverter input circuit 404 and the CMOS inverter output circuit 405 are connected in series between a source terminal 402 and a ground terminal 403, with the input circuit, the output circuit, the external connector terminal 401, the internal circuit and the like connected as in the first embodiment.

The following is an explanation of an example in which the structure achieved in the embodiment is adopted in the output circuit 405 constituted of a CMOS inverter and, in particular, in the nMOS output circuit element 409, as in the first embodiment explained earlier.

FIG. 5 is a cross section through line III—III in FIG. 2. In FIG. 5, a semiconductor substrate 504 may be constituted of, for instance, a p-type silicon (Si) single crystal and is connected to a ground terminal 403. In addition, the semiconductor integrated circuit device in the second embodiment, too, achieves an SOI structure with a semiconductor layer 506 formed over an insulator layer 505. As in the first embodiment, the nMOS output circuit element 409 is formed at the semiconductor layer 506.

As shown in FIG. 5, a first trench, which passes through a source area 501a constituting an impurity area of the nMOS output circuit element 409 and an insulating film 508 and extending to the semiconductor substrate 504, is provided. A first conductive area 511 of the first conductivity type (hereinafter also referred to as "conduction type") with for instance B, which is a p-type impurity induced into it to achieve the same conductivity as the semiconductor substrate 504, is provided at the portion of the semiconductor substrate 504 under the source area 501a where the first trench 512a is located.

In addition, a first conductor 510a, constituted of, for instance, tungsten, which electrically connects the first conductive area 511, the source area 501a constituting an impurity area of the first circuit element and a source electrode 503a, is formed inside the first trench 512a. The source electrode 503a, which may be constituted of a metal such as aluminum (Al) or an Al alloy, is electrically connected with the ground terminal 403.

By adopting the structure, a substrate resistor 413 with one end of thereof constituted of the first conductive area 511 is formed on the semiconductor substrate 504.

In addition, as in the first embodiment, a drain area 501b is electrically connected with a drain electrode 503b constituted of a metal such as Al or an Al alloy, and the drain electrode 503b is connected to the source terminal 401.

In the embodiment, the p-type first conductive layer 511, formed inside the p-type semiconductor substrate 504 located under the source area 501a so as to connect with the source area 501a, is also connected with the substrate resistor 413. A surge voltage applied to the semiconductor layer 506 is promptly transmitted to the semiconductor substrate 504 under the insulator layer 505 by the substrate resistor 413, thereby reducing the difference between the potentials of the semiconductor layer 506 and the semiconductor substrate 504. In other words, the substrate resistor 413 functions as a protective element that protects the buried insulator layer 505 from an external surge voltage in the embodiment.

Namely, a surge voltage having entered through the external connector terminal 401 first travels from the drain area 501b of the nMOS output circuit element 409 through the channel area formed under a gate electrode 502 to be transmitted to the source area 501a. Then, the surge voltage, which has been transmitted to the source area 501a, is promptly transmitted to the area of the semiconductor substrate 504 under the insulator layer, i.e., the area under the drain area 501b, where the highest level of surge voltage is applied, via the substrate resistor 413 connected to the source area 301a. As a result, the levels of the voltages applied to the semiconductor layer 306 and the semiconductor substrate 304 become roughly equalized, to prevent breakdown at the insulator layer due to a high level of surge voltage applied through the external connector terminal 401.

In addition, in this embodiment in which a protective element (the substrate resistor 413) is formed under the source area 501a, too, it is possible to provide a protective element without increasing the capacitance relative to the external connector terminal 401.

It is to be noted that unlike in the first embodiment explained earlier, a protective element is formed only at the source area 501a in the second embodiment in which the first conductive layer is formed by inducing an impurity of the same conduction type as the semiconductor substrate 504.

As in the explanation of the first embodiment, an explanation is given with reference to the embodiment on an example in which both the input circuit and the output circuit are constituted of a CMOS inverter. However, in this embodiment, too, they may assume another structure as long as the input circuit and the output circuit are connected between the internal circuit and the external connector terminal 101 to input/output a signal to/from the internal circuit. Accordingly, they may each be constituted of an nMOS or a pMOS alone.

Furthermore, an explanation is given with reference to the second embodiment of an example in which the nMOS output circuit element 109 connected between the external connector terminal 101 and the internal circuit constitutes a first circuit element. However, the term "first circuit element" as used with reference to the embodiment refers to any circuit element having an impurity area that is connected to the external connector terminal 101. Accordingly, a first circuit element may be, for instance, a diffused resistor formed by inducing an impurity to an nMOS, a pMOS or the semiconductor layer.

The semiconductor integrated circuit device having the SOI structure explained above with reference to the second embodiment may, for instance, be manufactured through the following process. However, since the steps taken up to the point at which the formation of the first trench 512a is completed are identical to the steps explained with reference to the first embodiment, their explanation is omitted.

After the first trench 512a is formed, an impurity of the same conduction type as the semiconductor substrate 504, e.g., B, which is a p-type impurity, is induced via the first trench through ion implantation or the like to form the first conductive area 511 on the semiconductor substrate 504 and a junction node for joining with the substrate resistor 413 constituting the protective element is formed within the semiconductor substrate 504. During this process, the concentration of the impurity induced to the semiconductor substrate 504 should be set at, for instance, approximately $1 \times 10^{17 \sim 19}$ ions/cm$^3$, as in the previous embodiment. Next, tungsten (W) or the like is grown within the first trench 512a to form a first conductor 510a, which connects the first conductive area 511 that has been already formed and the source area 501a constituting the impurity area of the circuit element.

Subsequently, the output circuit 405 is formed by depositing a metal film constituted of Al or an Al alloy on the SOI substrate and patterning the metal film. The output circuit 405 is then connected to the external connector terminal 401, internal circuit and the like. The semiconductor integrated circuit in the second embodiment is manufactured through these steps.

As explained above, the substrate resistor 413 is formed directly under the nMOS output circuit element 409 as a protective element connected with the impurity area of the circuit element and the buried insulator layer 505 located under the semiconductor layer at which the semiconductor integrated circuit is formed is protected by transmitting a surge voltage from the outside to the semiconductor substrate 504 in the second embodiment. Thus, a highly reliable a semiconductor integrated circuit device is achieved in the embodiment by providing the substrate resistor 413 connected with the impurity area of the circuit element formed at the semiconductor layer.

In addition, the embodiment assumes a structure similar to that adopted in the first embodiment, and the substrate resistor 413 for protecting the insulator layer 505 is formed directly under the source area 501*a* of the output circuit. This eliminates the necessity for providing a special area over which the protective element is to be formed. As a result, breakdown at the insulator layer 505 is prevented while fully utilizing the limited available area. Consequently, a semiconductor integrated circuit that enables higher integration while maintaining a high degree of reliability is achieved through the second embodiment as well.

Furthermore, in the second embodiment, the substrate resistor 413 formed from the first conductive area 511 of the same conduction type as the semiconductor substrate, is provided as a protective element for the insulator layer 505. Constituting a protective element with the substrate resistor 413 instead of a PN junction diode eliminates the necessity for allowing the time for charging the voltage corresponding to the offset when communicating the surge voltage to the semiconductor substrate through the protective element, and thus, it becomes possible to transmit the surge voltage applied through the external connector terminal 401 even more promptly to the semiconductor substrate compared to the first embodiment explained earlier. As a result, a reduction in the length of time over which the high surge voltage is applied to the insulator layer 505 is achieved in the second embodiment employing the substrate resistor 413 as a protective element, to realize a semiconductor integrated circuit device in which the insulator layer 505 is protected with an even higher degree of reliability.

Figure 6:
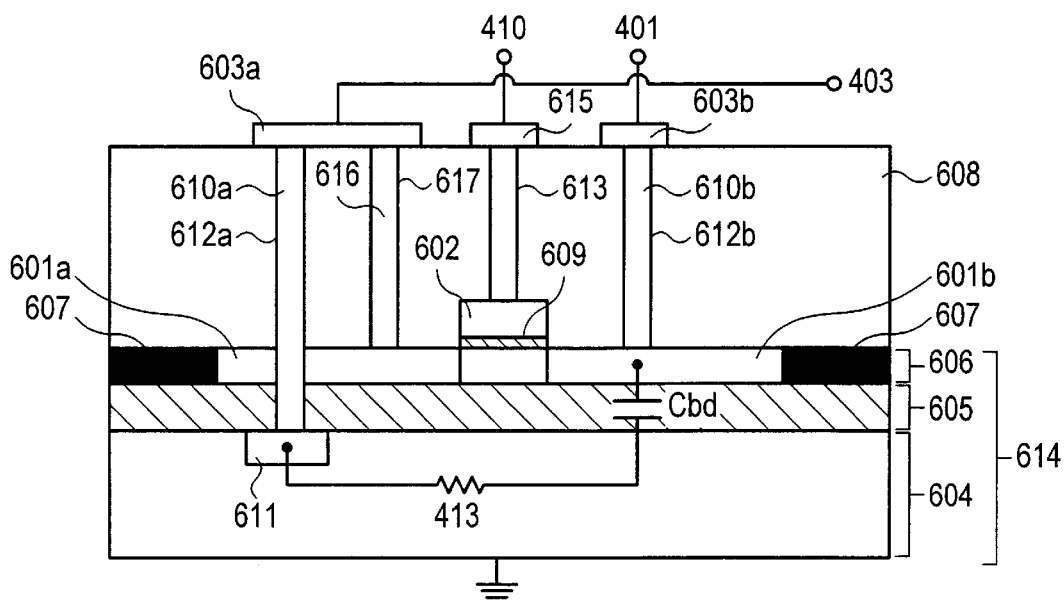
FIG. 6 is a cross section of the output circuit element constituting the output circuit in the semiconductor integrated circuit device in a third embodiment.

Next, the third embodiment of the present invention is explained with reference to the drawing. FIG. 6 illustrates the embodiment in a cross section through line III—III in FIG. 2. It is to be noted that the plan view of the embodiment is identical to that presented in FIG. 2 illustrating the first embodiment and is, therefore, omitted.

The third embodiment may be adopted by modification of the first embodiment having a PN junction diode provided as a protective element or the second embodiment having a substrate resistor provided as a protective element. It is even more desirable to adopt the third embodiment in applications of the first and second embodiments in which the conductivity type (hereinafter also referred to as "conduction type") of the impurity induced into the conductive layer formed within the semiconductor substrate is different from the conduction type of the impurity induced into the impurity area of a circuit element formed at the semiconductor layer.

In such an application, an impurity having the conduction type which is the reverse of the conduction type at the impurity area of the circuit element is induced through the first trench when forming the conductive area within the semiconductor substrate. As a result, a reaction may occur between the impurity induced through the first trench and the impurity within the impurity area of the circuit element to result in a reduction in the concentration of the impurity contained in the impurity area of the circuit element. The reduction in the impurity concentration may lead to difficulties in sustaining the electrical connection between the impurity area and the conductor connected to the protective element to result in a problem in that the characteristics of the semiconductor integrated circuit device become degraded.

Accordingly, the third embodiment is characterized by a first conductor 610*a* passing through at least either a first impurity area 601*a* or a second impurity area 601*b* formed at a semiconductor layer 606 and an insulator layer 605 and connected to a conductive area 611 provided at a semiconductor substrate 604 and a second conductor formed at a position away from the first conductor over a specific distance as an auxiliary means that assures an electrical connection with the impurity area 601*a* by achieving a potential on the surface of the first or second impurity area at a level essentially equal to the potential at the first conductor. In this structure, the levels of the potentials achieved by the first conductor and the second conductor at the first or second impurity area are essentially equal to each other and the difference in the potential that may result from the conductors having different lengths is not taken into consideration.

The following is an explanation of a specific example in which the embodiment is adopted in the output circuit 405 constituted of a CMOS inverter as in the preceding embodiment and, more specifically, in the output circuit 405 having an a substrate resistor 413 formed as a protective element under the source area 601 a of the nMOS output circuit element 409.

It is to be noted that as in the case of the first embodiment and the second embodiment, the third embodiment, too, may be adopted in a circuit element constituted of an nMOS or a pMOS alone instead of the circuit elements described above.

FIG. 6 is a cross section through line III—III in FIG. 2. The semiconductor substrate 604 in FIG. 6 illustrating the embodiment, too, is constituted of, for instance, a p-type silicon (Si) single crystal and is connected to the ground terminal 403.

The semiconductor integrated circuit device in the third embodiment achieves an SOI structure having the semiconductor layer 606 formed over the insulator layer 605. In addition, as in the first and second embodiments explained earlier, an nMOS output circuit element 409 is formed at the semiconductor layer 606.

In addition, an insulating film 608 is deposited over the semiconductor layer 606 at which the nMOS output circuit element 409 is formed, and a first trench 612*a* passing through the insulating film 608 and the source area 601*a* and extending to the semiconductor substrate 604 is provided at the source area 601*a* constituting an impurity area of the nMOS output circuit element 409, as shown in FIG. 6.

Furthermore, at the portion of the semiconductor substrate 604 located under the first trench 612*a*, a first conductive area 611 of a first conduction type having an impurity achieving the same conduction type as the impurity area 601*a* of the circuit element, e.g., B, which is a p-type impurity, induced thereto, is provided. A first conductor 610*a* constituted of tungsten or the like is formed to electrically connect the first conductive area 611, the source area 601*a* constituting the impurity area of the first circuit element and a source electrode 603*a*.

In the third embodiment, a second trench 617 is provided in the source area at a position different from the position at which the conductor (the first conductor 610a) formed inside the first trench 612a is located, and a second conductor 616 is provided inside the second trench 617 as an auxiliary means for ensuring an electrical connection with the source area. The second conductor 616 is electrically connected with the first conductor 610a, the source area 601a and the source electrode 603a.

In addition, a drain area 601b is provided at a trench 612b that only passes through the insulating film 608 deposited over the semiconductor layer 606, and the drain area 601b and a drain electrode 603b are electrically connected with each other through the trench 612b.

By providing the second conductor 616 so as to ensure that the individual components are positioned in the order of, a gate electrode 602, the second conductor 616 and the first conductor 610a as shown in FIG. 6, a positional relationship which is the same as the positional relationship achieved with respect to the operating range of a transistor without a protective element, is realized among a conductor 610b at the drain area, the gate electrode 602 and the second conductor 616. Thus, the electrical characteristics of the circuit element, such as the current drive capability, are sustained even when a protective element for protecting the buried insulator film is provided for the circuit element. As a result, a semiconductor integrated circuit that does not deviate from the design specifications is provided. It is desirable to adopt this structure in an output circuit or the like at which it is crucial to sustain the electrical characteristics.

By providing the second conductor 616 so as to position the individual components in the reverse order, i.e., in the order of; the gate electrode 602, the first conductor 610a and the second conductor 616, to set the second conductor 616 further away from the gate electrode 602 than the first conductor 610a, the protective element (substrate resistor 613 in this embodiment) is set closer to the portion of the insulator layer 605 located under the drain area 601b to be protected. Consequently, the surge voltage is transmitted even more promptly to the insulator layer 605 under the drain area where breakdown tends to occur most readily, via the protective element through which the surge voltage is transmitted to the semiconductor substrate 604. As a result, the difference between the potential at the semiconductor layer 606 and the potential at the semiconductor substrate 604 is reduced to prevent breakdown from occurring at the insulator layer 605 under the integrated circuit with a higher degree of reliability. It is desirable to adopt this structure in a protective circuit where the protective capability is crucial.

The semiconductor integrated circuit device having the SOI structure explained above with reference to the third embodiment may for instance be manufactured through the following process. However, since the steps taken prior to the formation of the first trench 612a extending to the semiconductor substrate 604 are identical to the steps explained with reference to the first and second embodiments, their explanation is omitted.

After depositing the insulating film 608 over the SOI substrate 614 through, for instance, a CVD method, the individual trench extending to the source area 601a, the drain area 601b and the gate electrode 602 are formed through, for instance, a dry etching method of the known art. It is to be noted that in the third embodiment, the first trench 612a and the second trench 616 are formed on the source area. Then, a resist is applied to the area other than the area where the first trench 612a, to be connected to the protective element, is formed. After the resist is applied, an etching process is implemented through a dry etching method of the known art to form the first trench 612a passing through the insulator layer 605 and extending to the semiconductor substrate 604.

Alternatively, as in the first embodiment, a metal film may be formed over the areas over which the trenches (the second trench and the trenches over the drain area and the gate electrode) other than the first trench 612a are to be formed through a sputtering method of the known art or the like after the formation of the output circuit element, prior to depositing the insulating film 608 over the SOI substrate 614. Then with the insulating film 608 deposited over the SOI substrate 614 to individually form the trenches extending to the drain area 601b and the gate electrode 602, the first trench 312a extending to the semiconductor substrate 304 and the second trench 617 extending to the source area 601a may be individually formed.

After the first trench is formed, an impurity of the same conduction type as the semiconductor substrate 604, e.g., B, which is a p-type impurity, is induced via the first trench 612a through ion implantation or the like to form the first conductive area 611 on the semiconductor substrate 604 and a junction node for joining with the substrate resistor 413 constituting the protective element is formed within the semiconductor substrate 604. During this process, the concentration of the impurity induced to the semiconductor substrate 604 should be set at, for instance, approximately $1 \times 10^{17 \sim 19}$ ions/cm$^3$, as in the previous embodiments.

Next, tungsten (W) or the like is grown within the first trench 612a to form the first conductor 610a, which connects the first conductive area 611 that has been already formed and the source area 601a constituting the impurity area of the circuit element. In addition, conductors constituted of tungsten or the like are also formed inside the trenches 612b, 613 and 617 as well as within the first trench 612a.

After depositing a metal film constituted of Al or an Al alloy over the SOI substrate, the metal film is patterned to form the output circuit 405. Through these steps, the semiconductor integrated circuit in the third embodiment is manufactured.

As explained above, in addition to the step in which the second conductor 616, which is different from the first conductor 610a connected with the protective element, is formed at the impurity area 601a, a step in which the first conductor 610a and the second conductor 616 are connected is implemented in the embodiment to protect the buried insulator layer 605 under the semiconductor layer 606 and also to assure an electrical connection with the impurity area.

Thus, by adopting the third embodiment in the first embodiment or the second embodiment explained earlier, it is possible to prevent breakdown at the insulator layer to the same extent as that achieved in the first or second embodiment and, at the same time, a semiconductor integrated circuit device capable of sustaining the electrical characteristics of the circuit at which the protective element is provided with a high degree of reliability is obtained.

Figure 7:
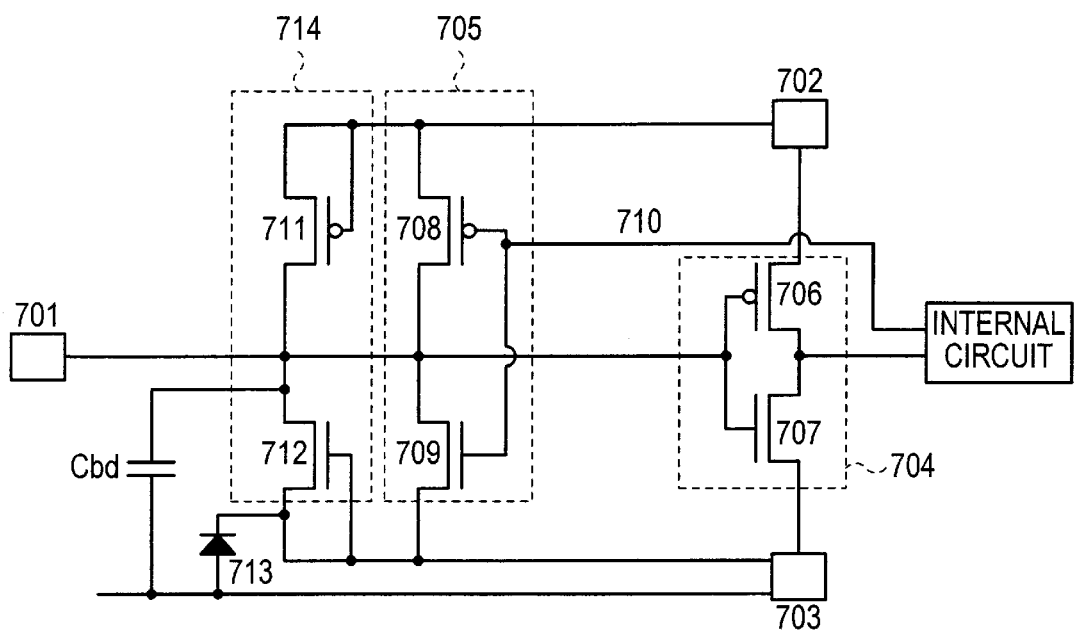
FIG. 7 is a circuit diagram of the semiconductor integrated circuit in a fourth embodiment.

Next, the fourth embodiment of the present invention is explained with reference to the drawings. FIG. 7 presents a circuit diagram of the semiconductor integrated circuit achieved in the fourth embodiment. It is to be noted that the plan view of the embodiment is identical to that in the first, second or third embodiment and is, therefore, omitted.

In the fourth embodiment, a protective circuit that protects the input circuit, the output circuit and the like from breakdown due to a surge voltage or the like applied from the outside is provided in addition to the circuit achieved in the first, second or third embodiment explained earlier, with at least one of the protective elements for protecting the buried insulator layer achieved in the first, second and third embodiments employed in an impurity area of a protective circuit element constituting the protective circuit and formed at the semiconductor layer of the SOI substrate.

As shown in FIG. 7, a protective circuit 714 comprising circuit elements such as a pMOS protective circuit element 711 and an nMOS protective circuit element 712 is connected between an external connector terminal 701 on one side and an input circuit 704 and an output circuit 705 on the other side in the fourth embodiment, with a PN junction diode 713 identical to the PN junction diode explained with reference to the first embodiment of the present invention provided at an impurity area of the nMOS protective circuit element 712, which is one of the protective circuit elements constituting the protective circuit as a protective element for the buried insulator layer.

This protective circuit 714 is connected in series between a source terminal 702 and a ground terminal 703, with the drain areas of the pMOS protective circuit element 711 and the nMOS protective circuit element 712 both connected to the external connector terminal 701 and the gate electrodes of the pMOS protective circuit element 711 and 712 respectively connected to the source terminal 702 and the ground terminal 703.

The fourth embodiment is now explained with reference to an example in which the PN junction diode 713 is provided as a protective element at the source area of the nMOS protective circuit element constituting the protective circuit. However, the primary feature of the embodiment is that a protective element for preventing breakdown at the buried insulator layer is formed under an impurity area of a protective circuit element constituting the protective circuit. Thus, the protective element in the embodiment may be constituted of either of the protective elements achieved in the second embodiment and the third embodiment instead of the PN junction diode 713.

In addition, while an explanation is given with reference to the embodiment on an example in which a protective element is provided only at the nMOS protective circuit element 712, it goes without saying that a similar protective element may also be provided at the pMOS protective circuit element 711.

By forming the protective circuit element constituting the protective circuit by using a MOS transistor identical to those used to form the circuit elements constituting the input circuit and the output circuit as shown in FIG. 7, the number of MOS transistors connected to the external connector terminal 701 and formed at the semiconductor layer is increased. In other words, the total gate width achieved by the MOS transistors connected to the external connector terminal 701 and formed at the semiconductor layer is increased. As a result, the electrostatic voltage withstanding performance (normally referred to as the ESD (electrostatic discharge) voltage withstanding performance), which achieves a positive correlation with the length of the total gate width of the MOS transistors of a single type connected to the external connector terminal 701, is further improved.

Alternatively, by using a resistor formed at the semiconductor layer and constituted of an impurity area with the two ends thereof connected the external connector terminal and the first circuit element instead of a MOS transistor as the protective circuit element to constitute a protective circuit for protecting the input/output circuits, a protective circuit that requires a smaller area than the protective circuit constituted of a MOS transistor is achieved and, at the same time, a protective element that protects the buried insulator layer can be provided.

As shown in FIG. 7, a protective element for protecting the buried insulator layer is provided only at an impurity area of the protective circuit element constituting the protective circuit in this example of the semiconductor integrated circuit device in the fourth embodiment provided with a protective circuit. Thus, it becomes possible to transmit a surge voltage to the substrate through the protective element provided at the protective circuit, which does not affect the operation of the internal circuit. As a result, breakdown at the insulator layer 305 is prevented without changing the electrical characteristics of the input circuit and the output circuit that affect the operation of the integrated circuit.

In addition, in the semiconductor integrated circuit device having the protective circuit, a protective element for protecting the buried insulator layer may be provided both at the input/output circuits and the protective circuit, thereby increasing the total number of protective elements in the semiconductor integrated circuit device. As a result, a surge voltage applied from the outside is allowed to flow to the semiconductor substrate even more promptly. Consequently, breakdown of the buried insulator layer can be prevented with an even higher degree of reliability.

As explained above, by adopting the present invention in which a protective element such as a PN junction diode or a substrate resistor provided at the semiconductor substrate is achieved by passing through to the insulator layer under the semiconductor layer in a semiconductor integrated circuit device having an SOI structure, breakdown at the insulator layer due to a surge voltage applied through the external connector terminal or the like is prevented. As a result, a semiconductor integrated circuit device capable of maintaining a high degree of reliability is provided.

The following is a brief explanation of the advantages achieved through typical examples of the implementation of the invention disclosed in the specification.

Namely, in the first embodiment, a PN junction diode constituting a protective element, which is connected to an impurity area of a circuit element, is formed directly under the circuit element, thereby providing protection for the buried insulator layer under the semiconductor layer at which the semiconductor integrated circuit is formed.

Thus, since it is not necessary to secure a special area for forming the protective element, the limited available area can be utilized effectively to achieve a highly reliable semiconductor integrated circuit that enables higher integration, thereby realizing the object.

In addition, by providing a protective element that is connected to the source area as in this embodiment, it becomes possible to provide a protective element without having to increase the capacitance relative to the external connector terminal. As a result, no delay occurs in the operation to achieve a semiconductor integrated circuit device capable of high-speed operation, which is the primary advantage of SOI, while preventing breakdown at the insulator layer.

In the second embodiment, a substrate resistor constituting a protective element connected to an impurity area of a circuit element is formed directly under the circuit element, thereby providing protection for the buried insulator layer under the semiconductor layer at which the semiconductor integrated circuit is formed.

The second embodiment, which achieves structural features identical to those in the first embodiment, also realizes advantages of the first embodiment such as a high degree of reliability, higher integration and high-speed drive.

Furthermore, since it is not necessary to allow for the period of time for charging the offset voltage in the second embodiment, which employs a substrate resistor as a protective element, the surge voltage can be transmitted even more promptly to the semiconductor substrate compared to the first embodiment, which employs a P/N diode for a protective element. As a result, a semiconductor integrated circuit device capable of protecting the insulator layer under the semiconductor layer with an even higher degree of reliability is obtained.

In the third embodiment, by implementing a step in which a second conductor that is different from the first conductor connected to the protective element is provided at the impurity area and also by connecting the first conductor and the second conductor, an electrical connection with the impurity area at the buried insulator layer under the semiconductor layer is protected.

The third embodiment, too, achieves a structure in which a protective element is provided directly under the impurity area of a circuit element as do the first and second embodiments explained earlier. Thus, the third embodiment, too, achieves advantages realized in the preceding embodiments, such as the assurance of a high degree of reliability, higher integration and high-speed drive.

In addition, since the first conductor connected to the protective element and the second conductor functioning as an auxiliary means for assuring the electrical connection are provided in the third embodiment, a semiconductor integrated circuit, in which the protective element only affects the electrical characteristics of the circuit at which it is provided to a lesser degree compared to the first and second embodiments that are not provided with the second conductor, is achieved. Consequently, it becomes possible to provide a protective element for protecting the insulator layer at the input circuit and the output circuit where it is extremely crucial to maintain specific electrical characteristics. Thus, a protective element for preventing breakdown at the insulator layer can be provided even in a semiconductor integrated circuit that does not require a protective circuit for protecting the input/output circuits from an external surge voltage, without having to secure a special area for accommodating the protective element. As a result, by adopting the third embodiment, a semiconductor integrated circuit device enabling even higher integration while maintaining reliability and allowing high-speed drive is obtained.

Lastly, in the fourth embodiment, a PN junction diode identical to that achieved in the first embodiment is provided as a protective element at an impurity area of a protective circuit element constituting a protective circuit for protecting the input/output circuits. In this embodiment, too, the protective circuit element provided with a protective element achieves a structure in which the protective element is located directly under an impurity area of a circuit element as in the first, second and third embodiments explained earlier. Thus, the fourth embodiment, too, achieves advantages of the preceding embodiments, such as assurance of a high degree of reliability, higher integration and high-speed drive.

In addition, since a protective element for protecting the buried insulator layer is provided in a semiconductor integrated circuit device having a protective circuit for protecting the input circuit and the output circuit from an external surge voltage in the fourth embodiment, breakdown at the insulator layer 305 can be prevented without changing the electrical characteristics of the input circuit and the output circuit, which affect the operation of the integrated circuit by providing a protective element for protecting the buried insulator layer only at an impurity area of a protective circuit element constituting the protective circuit.

Moreover, by providing a protective element for protecting the buried insulator layer both at the input/output circuits and the protective circuit, the total number of protective elements in the semiconductor integrated circuit is increased and, as a result, the external surge voltage is allowed to flow to the semiconductor substrate even more promptly to prevent breakdown of the buried insulator layer with an even higher degree of reliability.

What is claimed is:

1. A semiconductor integrated circuit device having an internal circuit, comprising:

a semiconductor substrate of a first conductivity type;

an insulator layer formed on the semiconductor substrate;

a semiconductor layer formed on the insulator layer;

a first impurity area formed in the semiconductor area;

a second impurity area formed in the semiconductor layer a predetermined distance from the first impurity area and connected to an external connector terminal, the external connector terminal receiving an input signal for input to the internal circuit or transmitting an output signal from the internal circuit;

a first gate electrode provided on an area between the first impurity area and the second impurity area;

a first conductivity area of a second conductivity type formed at the semiconductor substrate and under the first impurity area or the second impurity area; the second conductivity type being different from the first conductivity type; and a first conductor with the insulator layer and electrically connecting the first impurity area or the second impurity area and the first conductivity area, wherein the insulator layer is disposed between the first or second impurity area and the first conductivity area.

2. A semiconductor integrated circuit device according to claim 1, wherein the first and second impurity area and the gate electrode are parts of a first circuit element in an output circuit that transmits an output signal from the internal circuit to the external connector terminal.

3. A semiconductor integrated circuit device according to claim 1, further comprising a second conductor, separated from the first conductor by a predetermined distance, which supplies a potential essentially equal to the potential at the first conductor at the surface of the first impurity area or the second impurity area.

4. A semiconductor integrated circuit device according to claim 1, wherein the first and second impurity areas and the gate electrode are parts of a first circuit element, and further comprising an element formation area formed in the semiconductor layer;

a second circuit element which includes a third impurity area formed at the element formation area, with one end thereof connected to an electrode pad and another end thereof connected to the first impurity area or the second impurity area;

a second conductivity area of the second conductivity type formed at a portion of the semiconductor substrate located under the third impurity area; and a second conductor within the insulator layer and electrically connecting the third impurity area and the second conductivity area.

5. A semiconductor integrated circuit device according to claim 4, wherein the second conductor passes through the third impurity area, and further comprising a third conductor separated from the second conductor by a predetermined distance, which supplies a potential essentially equal to the potential of the second conductor at the surface of the third impurity area.

6. A semiconductor integrated circuit device according to claim 1, wherein the first and second impurity areas and the gate electrode are parts of a first circuit element, and further comprising:

an element formation area formed in the semiconductor layer;

a second circuit element which includes a third impurity area formed at the element formation area, a fourth impurity area formed at the element formation area a predetermined distance from the third impurity area, the fourth impurity area being connected to an electrode pad, and a second gate electrode provided on an area between the third impurity area and the fourth impurity area;

a second conductivity area of the second conductivity type formed at a portion of the semiconductor substrate under at least either the third impurity area or the fourth impurity area; and a second conductor within the insulator layer to connect the third impurity area or the fourth impurity area to the second conductivity area.

7. A semiconductor integrated circuit device according to claim 6, wherein the second conductor passes through at least either the third impurity area or the fourth impurity area, and further comprising a third conductor separated from the second conductor by a predetermined distance, the third conductor supplying a potential essentially equal to the potential at the second conductor at the surface of the third impurity area or the fourth impurity area.

8. A semiconductor integrated circuit device according to claim 1, wherein the the first and second impurity areas and the gate electrode are parts of a first circuit element, and further comprising:

an element formation area formed in the semiconductor layer;

a second circuit element which includes a third impurity area formed at the element formation area a predetermined distance from the third impurity area, the fourth impurity area being connected to an electrode pad, and a second gate electrode provided on an area between the third impurity area and the fourth impurity area;

a second conductivity area of the first conductivity type formed under the third impurity area; and a second conductor within the insulator layer to connect the third impurity area and the second conductivity area.

9. A semiconductor integrated circuit device according to claim 8, wherein the second conductor passes through the third impurity area, and further comprising a third conductor separated from the second conductor by a predetermined distance, which supplies a potential essentially equal to the potential of the second conductor at the surface of the third impurity area.

10. A semiconductor integrated circuit device having an internal circuit, comprising:

a semiconductor substrate of a first conductivity type;

an insulator layer formed on the semiconductor substrate;

a semiconductor layer formed on the insulator layer;

a first element formation area, and a second element formation area separate from the first element formation area, both formed at the semiconductor layer;

a first circuit element formed at the first element formation area;

a second circuit element formed at the second element formation area and including an impurity area spaced from the first circuit element and connected to an external connector terminal, the external connector terminal receiving an input signal for input to the internal circuit or transmitting an output signal from the internal circuit;

a conductivity area of a second conductivity type, formed at a portion of the semiconductor substrate under the impurity area, the second conductivity type being different from the first conductivity type; and a first conductor within the insulator layer and electrically connecting the circuit element and the conductivity area, wherein the insulator layer is disposed between the impurity area and the conductivity area.

11. A semiconductor integrated circuit device having an internal circuit, comprising:

a semiconductor substrate of a first conductivity type;

an insulator layer formed on the semiconductor substrate;

a semiconductor layer formed on the insulator layer;

a first circuit element formed at the semiconductor layer the first circuit element including a first impurity area formed in the semiconductor layer, a second impurity area formed in the semiconductor layer a predetermined distance from the first impurity area and connected to an external connector terminal that receives an input signal for input to the internal circuit or that transmits an output signal from the internal circuit, and a first gate electrode provided on an area between the first impurity area and the second impurity area;

a first conductivity area of the first conductivity type formed at the semiconductor substrate and under the first impurity area; and a first conductor within the insulator layer and electrically connecting the first impurity area to the first conductivity area, wherein the insulator layer is disposed between the first impurity area and the first conductivity area, wherein the insulator layer is disposed between the first impurity area and the first conductivity area.

12. A semiconductor integrated circuit device according to claim 11, wherein the first circuit element is part of an output circuit that transmits an output signal from the internal circuit to the external connector terminal.

13. A semiconductor integrated circuit device according to claim 11, further comprising a second conductor that is separated from the first conductor by a predetermined distance, which supplies a potential equal to the potential at the first conductor at the surface of the first impurity area or the second impurity area.

14. A semiconductor integrated circuit device according to claim 11, further comprising a second element formation area formed in the semiconductor layer;

a second circuit element which includes a third impurity area formed at the second element formation area, with one end thereof connected to an electrode pad and another end thereof connected to the second impurity area;

a second conductivity area of a second conductivity type formed at a portion of the semiconductor substrate located under the third impurity area, the second conductivity type being different from the first conductivity type; and a second conductor within the insulator layer and electrically connecting the third impurity area and the second conductivity area.

15. A semiconductor integrated circuit device according to claim 14, wherein the second conductor passes through the third impurity area, and further comprising a third conductor separated from the second conductor by a predetermined distance, which supplies a potential essentially equal to the potential of the second conductor at the surface of the third impurity area.

16. A semiconductor integrated circuit device according to claim 11, wherein the semiconductor layer has a first element formation area in which the first and second impurity areas formed, and further comprising;

a second element formation area spaced from the first element formation area;

a second circuit element which includes a third impurity area formed in the second element formation area, a fourth impurity area formed in the second element formation area, spaced a predetermined distance from the third impurity area and connected to an electrode pad; and a second gate electrode provided between the third impurity area and the fourth impurity area;

a second conductivity area of the first conductivity type formed at a portion of the semiconductor substrate under the third impurity area; and a second conductor within the insulator layer and electrically connecting the third impurity area and the second conductivity area, wherein the insulator layer is disposed between the third impurity area and the second conductivity area formed under the third impurity area.

17. A semiconductor integrated circuit device according to claim 16, further comprising a third conductor spaced from the second conductor by a predetermined distance, which supplies a potential essentially equal to the potential of the second conductor at the surface of the third impurity area or the fourth impurity area.

18. A semiconductor integrated circuit device according to claim 11, wherein the first conductor includes tungsten.

19. A semiconductor integrated circuit device according to claim 11, wherein a ground potential is applied to the first impurity area and the substrate.

20. A semiconductor integrated circuit device having an internal circuit, comprising:

a semiconductor substrate of a first conductivity type;

an insulator layer formed on the semiconductor substrate;

a semiconductor layer formed on the insulator layer, the semiconductor layer having a first element formation area and a second element formation area;

a first circuit element formed in the first element formation area;

a second circuit element formed in the second element formation area, the second circuit element including a first impurity area formed in the second element formation area, a second impurity area formed in the second element formation area a specific distance from the first impurity area and connected to an external connector terminal, the external connector terminal receiving an input signal to the internal circuit or transmitting an output signal from the internal circuit, and a first gate electrode provided above an area between the first impurity area and the second impurity area;

a first conductivity area of the first conductivity type formed at a portion of the semiconductor substrate located under the third impurity area; and a first conductor within the insulator layer and electrically connecting the third impurity area and the first conductivity area, wherein the insulator layer is disposed between the third impurity area and the first conductivity area.

21. A semiconductor integrated circuit device having an internal circuit, comprising:

a semiconductor substrate of a first conductivity type;

an insulator layer formed in the semiconductor substrate;

a semiconductor layer formed on the insulator layer;

a first circuit element which includes a first impurity area formed in the semiconductor layer, with one end thereof being connected to the internal circuit and another end thereof being connected to an external connector terminal, the external connector terminal receiving an input signal for input to the internal circuit or transmitting an output signal from the internal circuit;

a first conductivity area of a second conductivity type formed in a portion of the semiconductor substrate located under the first impurity area, the second conductivity type being different from the first conductivity type; and a first conductor within the insulator layer and electrically connecting the first impurity area and the first conductivity area, wherein the insulator layer is disposed between the first impurity area and the first conductivity area.

22. A semiconductor integrated circuit device according to claim 21, further comprising a second conductor formed a specific distance away from the first conductor, such that a potential at a surface of the first impurity area is equal to the potential at the first conductor.

23. A semiconductor integrated circuit device according to claim 21, wherein the semiconductor layer has a first element formation area in which the first impurity area is formed, and further comprising;

a second element formation area that is spaced from the first element formation area;

a second circuit element which includes a second impurity area formed in the second element formation area, a third impurity area formed in the second element formation area, spaced a predetermined distance from the second impurity area and connected to an electrode pad, and a second gate electrode provided between the second impurity area and the third impurity areas;

a second conductivity area of the second conductivity type formed at a portion of the semiconductor substrate under at least either the second impurity area or the third impurity area; and a second conductor passing through the second impurity area or the third impurity area and the insulator layer and connecting the second impurity area or the third impurity area to the second conductivity area, wherein the insulator layer is disposed between the second impurity area or the third impurity area and the second conductivity area.

24. The semiconductor integrated circuit device according to claim 1, wherein the first conductor passes through the first or second impurity area and the insulator layer.

25. The semiconductor integrated circuit device according to claim 1, wherein the first conductor includes tungsten.

26. The semiconductor integrated circuit device according to claim 1, wherein a ground potential is applied to the first impurity area and the semiconductor substrate.

27. The semiconductor integrated circuit device according to claim 10, wherein the first conductor passes through the impurity area and the insulator layer.

28. The semiconductor integrated circuit device according to claim 10, wherein the first conductor includes tungsten.

29. The semiconductor integrated circuit device according to claim 10, wherein a ground potential is applied to the first impurity area and the semiconductor substrate.

30. The semiconductor integrated circuit device according to claim 11, wherein the first conductor passes through the first impurity area and the insulator layer.

31. The semiconductor integrated circuit device according to claim 21, wherein the first conductor passes through the first impurity area and the insulator layer.

32. The semiconductor integrated circuit device according to claim 21, wherein the first conductor includes tungsten.

33. The semiconductor integrated circuit device according to claim 21, wherein a ground potential is applied to the first impurity area and the semiconductor substrate.

34. A semiconductor integrated circuit device having an internal circuit and an external connection terminal, comprising:

a semiconductor substrate;

an insulator layer on the substrate;

a semiconductor layer on the insulator layer;

an inverter fabricated on the semiconductor layer, the inverter including a transistor having an impurity area, signals being transferred between the external connection terminal and the internal circuit by way of the inverter; and a conductor which passes through the insulator layer and electrically connects the impurity area to the substrate.

* * * * *